US008891234B2

(12) United States Patent
Huang et al.

(10) Patent No.: US 8,891,234 B2
(45) Date of Patent: Nov. 18, 2014

(54) ELECTRONIC APPARATUS WITH HEAT DISSIPATION MODULE

(71) Applicants: Lung-Chi Huang, New Taipei (TW); Chih-Hao Yang, New Taipei (TW)

(72) Inventors: Lung-Chi Huang, New Taipei (TW); Chih-Hao Yang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 149 days.

(21) Appl. No.: 13/654,885

(22) Filed: Oct. 18, 2012

(65) Prior Publication Data

US 2013/0215570 A1 Aug. 22, 2013

(30) Foreign Application Priority Data

Feb. 21, 2012 (TW) .............................. 101105580 A

(51) Int. Cl.
*G06F 1/20* (2006.01)
*H01L 23/467* (2006.01)
*H05K 7/20* (2006.01)
*H01L 23/427* (2006.01)

(52) U.S. Cl.
CPC ............. *G06F 1/203* (2013.01); *H01L 23/467* (2013.01)
USPC ............ 361/679.47; 361/679.49; 361/679.52; 361/696; 361/701; 361/719; 203/80.2; 203/80.5; 203/104.21; 203/104.26; 203/104.33

(58) Field of Classification Search
CPC .......... G06F 1/20; G06F 1/203; G06F 1/206; H05K 7/20; H01L 23/427; H01L 23/467; H01L 23/473
USPC ...................... 361/679.46–679.55, 688, 689, 361/695–697, 700–712, 715, 719–722; 165/80.2, 80.3, 80.4, 80.5, 104.14, 165/104.21, 104.26, 104.33, 122–126, 185; 174/15.2, 16.3, 252, 520; 454/184; 257/706, 713, 715, 722, 724
See application file for complete search history.

(56) References Cited

U.S. PATENT DOCUMENTS

| | | | | |
|---|---|---|---|---|
| 7,325,590 | B2 * | 2/2008 | Kim et al. ................. | 165/104.33 |
| 7,458,415 | B2 * | 12/2008 | Hashimoto et al. .......... | 165/80.3 |
| 7,551,443 | B2 * | 6/2009 | Liu et al. ........................ | 361/700 |
| 7,643,284 | B2 * | 1/2010 | Nakamura ............... | 361/679.47 |
| 7,965,512 | B2 * | 6/2011 | Huang et al. .................. | 361/700 |
| 8,270,166 | B2 * | 9/2012 | Chen ............................ | 361/700 |
| 2004/0201958 | A1 * | 10/2004 | Lev .............................. | 361/687 |
| 2006/0162901 | A1 * | 7/2006 | Aizono et al. ............... | 165/80.4 |
| 2007/0267172 | A1 * | 11/2007 | Hwang et al. ................ | 165/80.3 |
| 2008/0093056 | A1 * | 4/2008 | Hwang et al. ............. | 165/104.33 |
| 2010/0195280 | A1 * | 8/2010 | Huang et al. ............. | 361/679.47 |
| 2012/0050983 | A1 * | 3/2012 | Chen ........................ | 361/679.47 |
| 2012/0293958 | A1 * | 11/2012 | Lee ............................... | 361/696 |

* cited by examiner

*Primary Examiner* — Michail V Datskovskiy
(74) *Attorney, Agent, or Firm* — Novak Druce Connolly Bove + Quigg LLP

(57) ABSTRACT

An electronic apparatus includes a chassis and a heat dissipation module. The chassis includes a first panel, a second panel substantially parallel to the first panel, and a motherboard attached on the first panel and located between the first panel and the second panel. The heat dissipation module is attached on the motherboard and includes a fan with a cover, a first fin assembly attached to a first side of the fan, and a second fin assembly attached to a second side of the fan. The cover includes a main plate with an opening and a resisting flange extending slantwise from an edge of the opening. A portion of the first fin assembly is exposed by the opening. The resisting flange resists against the second panel to keep the main plate away from the second panel.

19 Claims, 4 Drawing Sheets

ELECTRONIC APPARATUS WITH HEAT DISSIPATION MODULE

BACKGROUND

1. Technical Field

The present disclosure relates to an electronic apparatus with a heat dissipation module.

2. Description of Related Art

With the development of electronics technology, an electronic apparatus such as a computer or a server is much thinner and smaller and yet contains more electronic components than before. The electronic components generate a large amount of heat during operation. A heat dissipation module is used in the electronic apparatus for dissipating the heat. A lower side of the heat dissipation module thermally contacts one of the electronic components, such as a central processing unit (CPU). An upper side of the heat dissipation module contacts a panel of the electronic apparatus. There is no space between the heat dissipation module and the panel, which may result in a poor heat-dissipating efficiency.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings, like references indicate similar elements. It should be noted that references to "an" or "one" embodiment in this disclosure are not necessarily to the same embodiment, and such references mean at least one.

Figure 1:
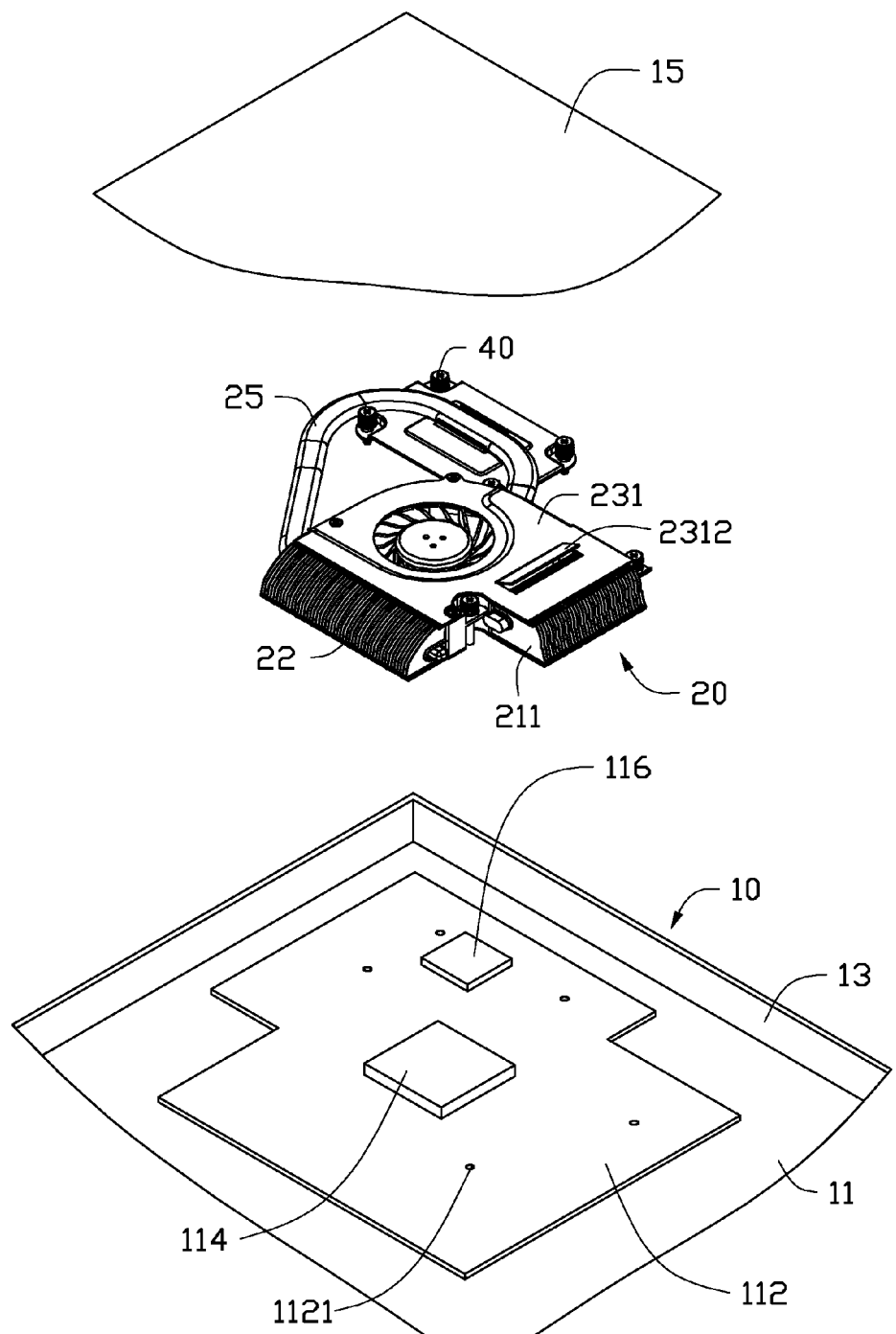
FIG. 1 is an isometric, exploded view of an electronic apparatus in accordance with an embodiment.

Referring to FIG. 1, an embodiment of an electronic apparatus is shown. The electronic apparatus includes a chassis 10 and a heat dissipation module 20 installed in the chassis 10. In one embodiment, the electronic apparatus may be a computer.

The chassis 10 includes a base panel 11, a side panel 13 extending from a side edge of the base panel 11, and a top panel 15 adapted to be mounted on the side panel 13. A motherboard 112 is attached on the base panel 11. A plurality of mounting holes 1121 is defined in the motherboard 112. A first heat generating component 114 and a second heat generating component 116 are attached on the motherboard 112. In one embodiment, the first heat generating component 114 is a CPU. The second heat generating component 116 is a Graphic Processing Unit (GPU).

Figure 2:
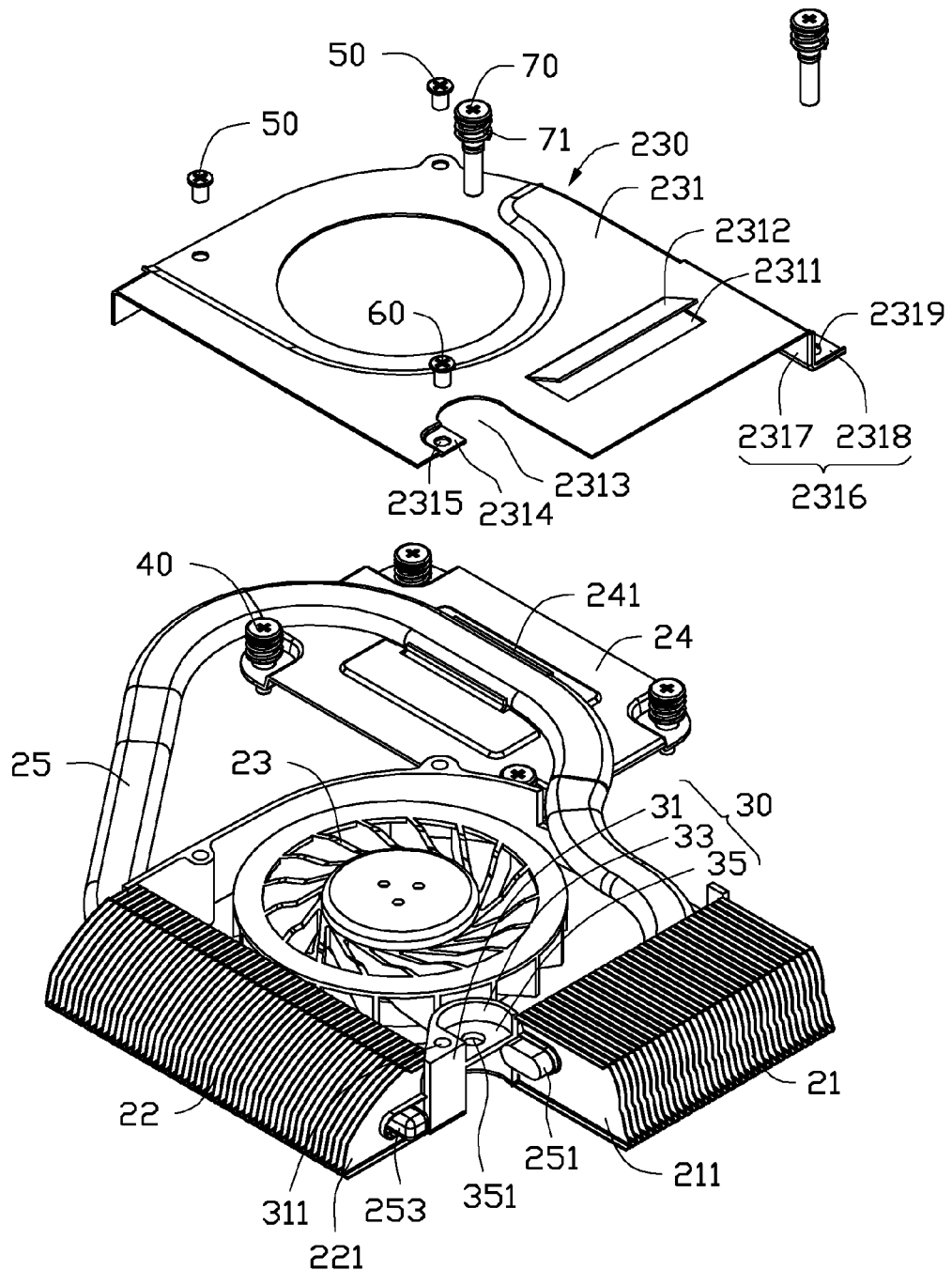
FIG. 2 is an exploded view of a heat dissipation module of the electronic apparatus of FIG. 1.

Referring to FIGS. 1 and 2, the heat dissipation module 20 includes a first fin assembly 21, a second fin assembly 22, a fan 23, a heat spreader 24, and a heat pipe 25. The first fin assembly 21 is attached to a first side of the fan 23. The second fin assembly 22 is attached to a second side of the fan 23. The first side and the second side are perpendicular and adjacent to each other. The first fin assembly 21 includes a plurality of spaced, substantially parallel, first fins 211. The second fin assembly 22 includes a plurality of spaced, substantially parallel, second fins 221. Each of the first fins 211 is substantially perpendicular to the second fins 221. A pair of clamping pieces 241 protrudes from the heat spreader 24 for clamping the heat pipe 25. The heat pipe 25 is curved and includes a first end 251 extending through the first fin assembly 21 and a second end 253 extending through the second fin assembly 22. A middle portion of the heat pipe 25 is clamped by the pair of clamping pieces 241 contacts the heat spreader 24.

The heat dissipation module 20 further includes a mounting block 30 located at a corner of the fan 23. The corner is located between the first fin assembly 21 and the second fin assembly 22. The mounting block 30 includes a rib 31, a holding portion 33 extending from the rib 31, and a base plate 35 connected to a base edge of the holding portion 33. A securing hole 311 is defined in the rib 31. A fixing hole 351 is defined in the base plate 35. In one embodiment, the rib 31 has a prism-like shape. The holding portion 33 is arc-shaped.

The heat dissipation module 20 further includes a top cover 230 adapted to cover the fan 23. The top cover 230 includes a main plate 231 and an L-shaped flange 2316 extending downward from an edge of the main plate 231. A rectangular opening 2311 is defined in the main plate 231. A resisting flange 2312 extends slantingly and upward from a long edge of the rectangular opening 2311. A gap 2313 is defined in one corner of the main plate 231 corresponding to the mounting block 30. The main plate 231 includes a sunken piece 2314 positioned adjacent to the gap 2313. A locking hole 2315 is defined in the sunken piece 2314. The L-shaped flange 2316 includes a vertical part 2317, extending perpendicularly from the edge of the main plate 231, and a horizontal part 2318, extending perpendicularly from a lower edge of the vertical part 2317. An opening 2319 is defined in the horizontal part 2318 corresponding to the mounting hole 1121.

Figure 3:
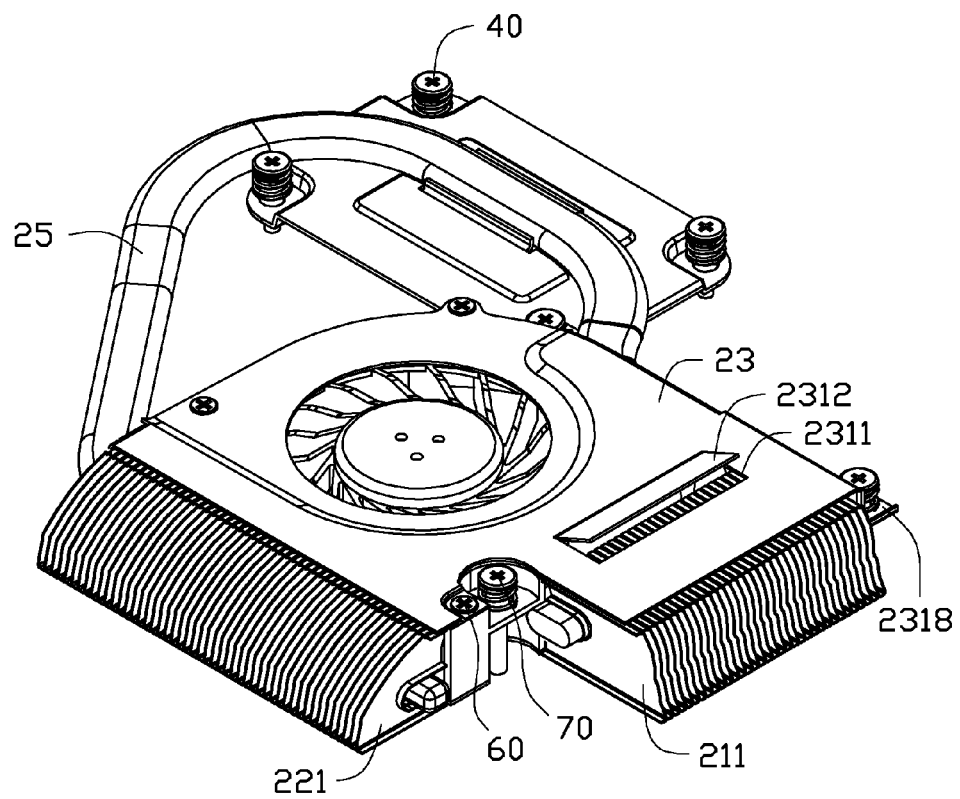
FIG. 3 is an assembled view of the heat dissipation module of FIG. 2.
Figure 4:
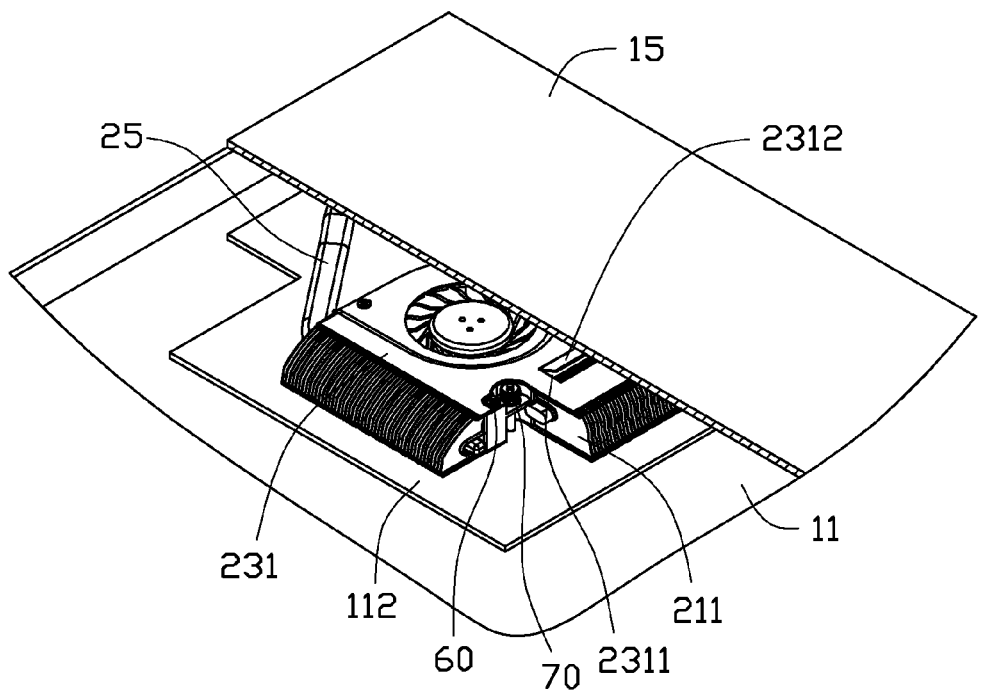
FIG. 4 is an assembled view of the electronic apparatus of FIG. 1.

Referring to FIGS. 3 and 4, in assembly, the fan 23 is placed on the first heat generating component 114. The heat spreader 24 is placed on the second heat generating component 116 and secured to the motherboard 112 by a plurality of fasteners 40. The top cover 230 is secured on the fan 23 by two securing members 50. The locking hole 2315 is aligned with the securing hole 311. A fixing member 60 is engaged in the locking hole 2315 and the securing hole 311 to secure the top cover 230 on the fan 23. The rectangular opening 2311 is located above the first fin assembly 21, which facilitates transferring heated air out from the first fin assembly 21. The fixing hole 351 is aligned with a first one of the plurality of mounting holes 1121. The opening 2319 is aligned with a second one of the plurality of mounting holes 1121. The heat dissipation module 20 is secured on the motherboard 112 by two mounting members 70. Each of the mounting members 70 includes a head, a cylindrical post extending from the head, and a spring 71 attached to the cylindrical post. One of the mounting members 70 extends into the fixing hole 351 and the first one of the plurality of mounting holes 1121. The spring 71 of the one of the mounting members 70 abuts against the base plate 35. The other one of mounting members 70 extends into the opening 2319 and the second one of the plurality of mounting holes 1121. The top panel 15 is secured on the side panel 13. The resisting flange 2312 abuts against an inner side of the top panel 15. The main plate 231 is spaced from the top panel 15, which is beneficial for heat dissipation.

During operation of the electronic apparatus, the fan 23 draws heated air from the first heat generating component 114 to the first fin assembly 21 and the second fin assembly 22. The first fin assembly 21 and the second fin assembly 22 both help to dissipate heat for the first heat generating component 114. The heat spreader 24 absorbs heat generated from the second heat generating component 116. The heat pipe 25 then absorbs heat in the heat spreader 24 and transfers it to the first fin assembly 21 and the second fin assembly 22. Thus, the heat dissipation module 20 can dissipate heat for the first heat generating component 114 and the second heat generating component 116 simultaneously.

While the present disclosure has been illustrated by the description in this embodiment, and while the embodiment has been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. An electronic apparatus comprising:
a chassis comprising a first panel; a second panel, substantially parallel to the first panel; and a motherboard, attached on the first panel and located between the first panel and the second panel; and
a heat dissipation module, attached on the motherboard, comprising a fan with a cover; a first fin assembly, attached to a first side of the fan; and a second fin assembly attached to a second side of the fan; the first side being substantially perpendicular and adjacent to the second side; and the cover comprising a main plate with an opening, defined therein, and a resisting flange, extending slantwise from an edge of the opening;
wherein a portion of the first fin assembly is exposed by the opening, and the resisting flange is resisted against the second panel to keep the main plate away from the second panel.

2. The electronic apparatus of claim 1, wherein a first heat generating component and a second heat generating component are attached on the motherboard, and the fan is attached to the first heat generating component.

3. The electronic apparatus of claim 2, wherein the heat dissipation module further comprises a heat spreader attached on the second heat generating component, each of the first fin assembly and the second fin assembly is in proximity to a first corner of the fan, the heat spreader is attached to a second corner of the fan, and the first corner and the second corner are diagonal corners of the fan.

4. The electronic apparatus of claim 3, where the first fin assembly comprises a plurality of first fins, the second fin assembly comprises a plurality of second fins, and each of the plurality of first fins is substantially perpendicular to the plurality of second fins.

5. The electronic apparatus of claim 4, wherein the heat dissipation module further comprises a heat pipe, a first end of the heat pipe extends through the first fin assembly, a second end of the heat pipe extends through the second fin assembly, and a central portion of the heat pipe is attached on the heat spreader.

6. The electronic apparatus of claim 3, wherein the heat dissipation module further comprises a mounting block located at the first corner, the mounting block comprises a rib, a holding portion extends from the rib, and a base plate is connected to a bottom edge of the holding portion.

7. The electronic apparatus of claim 6, wherein a securing hole is defined in the rib for securing the cover on the fan; and a fixing hole is defined in the base plate, for securing the heat dissipation module on the motherboard.

8. The electronic apparatus of claim 7, wherein a mounting member extends into the fixing hole and a mounting hole in the motherboard, for securing the heat dissipation module on the motherboard; and the mounting member comprises a spring resisting against the base plate.

9. The electronic apparatus of claim 7, wherein the holding portion is arc shaped; and a gap is defined in the main plate, corresponding to the holding portion.

10. An electronic apparatus comprising:
a chassis comprising a base panel; a motherboard, attached on the base panel; and a top panel, the motherboard comprising a first heat generating component and a second heat generating component; and
a heat dissipation module comprising a fan located, above the first heat generating component; a cover, attached on the fan; a first fin assembly, connected to a first side of the fan; a second fin assembly, connected a second side of the fan; and a heat spreader, connected to the fan and attached on the second heat generating component; and the cover comprising a main plate, substantially parallel to the base panel and the top panel; and a resisting flange, extending slantwise from the main plate and resisted against the top panel.

11. The electronic apparatus of claim 10, wherein the first side is substantially perpendicular and adjacent to the second side.

12. The electronic apparatus of claim 11, wherein a rectangular opening is defined in the main plate, the resisting flange is extended from a long edge of the rectangular opening, and a portion of the first fin assembly is exposed by the rectangular opening.

13. The electronic apparatus of claim 10, wherein each of the first fin assembly and the second fin assembly is in proximity to a first corner of the fan, the heat spreader is attached to a second corner of the fan, and the first corner and the second corner are diagonal corners of the fan.

14. The electronic apparatus of claim 13, where the first fin assembly comprises a plurality of first fins, the second fin assembly comprises a plurality of second fins, and each of the plurality of first fins is substantially perpendicular to the plurality of second fins.

15. The electronic apparatus of claim 14, wherein the heat dissipation module further comprises a heat pipe, a first end of the heat pipe extends through the first fin assembly, a second end of the heat pipe extends through the second fin assembly, and a central portion of the heat pipe is attached on the heat spreader.

16. The electronic apparatus of claim 13, wherein the heat dissipation module further comprises a mounting block located at the first corner, the mounting block comprises a rib, a holding portion extends from the rib, and a base plate is connected to a bottom edge of the holding portion.

17. The electronic apparatus of claim 16, wherein a securing hole is defined in the rib for securing the cover on the fan; and a fixing hole is defined in the base plate for securing the heat dissipation module on the motherboard.

18. The electronic apparatus of claim 17, wherein a mounting member extends into the fixing hole and a mounting hole in the motherboard for securing the heat dissipation module on the motherboard; and the mounting member comprises a spring resisting against the base plate.

19. The electronic apparatus of claim 16, wherein the holding portion is arc shaped; and a gap is defined in the main plate, corresponding to the holding portion.

* * * * *